(12) United States Patent
Khmelichek et al.

(10) Patent No.: US 7,253,879 B2
(45) Date of Patent: Aug. 7, 2007

(54) LIQUID IMMERSION LITHOGRAPHY SYSTEM WITH TILTED LIQUID FLOW

(75) Inventors: Aleksandr Khmelichek, Brooklyn, NY (US); Louis Markoya, Sandy Hook, CT (US); Harry Sewell, Ridgefield, CT (US)

(73) Assignee: ASML Holding N.V., Veldhoven (NL)

( * ) Notice: Subject to any disclaimer, the term of this patent is extended or adjusted under 35 U.S.C. 154(b) by 0 days.

(21) Appl. No.: 11/586,639

(22) Filed: Oct. 26, 2006

(65) Prior Publication Data

US 2007/0041002 A1    Feb. 22, 2007

Related U.S. Application Data

(63) Continuation of application No. 11/108,673, filed on Apr. 19, 2005.

(51) Int. Cl.
  *G03B 27/42* (2006.01)
  *G03B 27/52* (2006.01)
  *G03B 27/32* (2006.01)
(52) U.S. Cl. .............................. 355/53; 355/30; 355/77
(58) Field of Classification Search ................. 355/30, 355/53, 55, 77
   See application file for complete search history.

(56) References Cited

U.S. PATENT DOCUMENTS

| | | | |
|---|---|---|---|
| 3,573,975 A | 4/1971 | Dhaka et al. | |
| 3,648,587 A | 3/1972 | Stevens | |
| 4,346,164 A | 8/1982 | Tabarelli et al. | |
| 4,390,273 A | 6/1983 | Loebach et al. | |
| 4,396,705 A | 8/1983 | Akeyama et al. | |
| 4,405,701 A | 9/1983 | Banks et al. | |
| 4,480,910 A | 11/1984 | Takanashi et al. | |
| 4,509,852 A | 4/1985 | Tabarelli et al. | |
| 5,040,020 A | 8/1991 | Rauschenbach et al. | |
| 5,610,683 A | 3/1997 | Takahashi | |
| 5,715,039 A | 2/1998 | Fukuda et al. | |
| 5,825,043 A | 10/1998 | Suwa | |
| 5,900,354 A | 5/1999 | Batchelder | |
| 6,191,429 B1 | 2/2001 | Suwa | |
| 6,236,634 B1 | 5/2001 | Lee et al. | |

(Continued)

FOREIGN PATENT DOCUMENTS

DE    206607    2/1984

(Continued)

OTHER PUBLICATIONS

"Depth-of-Focus Enhancement Using High Refractive Index Layer on the Imaging Layer", IBM Technical Disclosure Bulletin, vol. 27, No. 11, Apr. 1985, p. 6521.

(Continued)

*Primary Examiner*—Henry Hung Nguyen
(74) *Attorney, Agent, or Firm*—Sterne, Kessler, Goldstein & Fox, PLLC (57) ABSTRACT

A liquid immersion lithography system including a projection optical system for directing electromagnetic radiation onto a substrate, and a showerhead for delivering liquid flow between the projection optical system and the substrate. The showerhead includes an injection nozzle and a retrieval nozzle located at different heights. The liquid flow is tilted relative to the substrate. A direction from the injection nozzle to the retrieval nozzle is tilted at approximately 1 to 2 degrees relative to the substrate.

3 Claims, 7 Drawing Sheets

U.S. PATENT DOCUMENTS

| | | |
|---|---|---|
| 6,560,032 B2 | 5/2003 | Hatano |
| 6,600,547 B2 | 7/2003 | Watson et al. |
| 6,603,130 B1 | 8/2003 | Bisschops et al. |
| 6,633,365 B2 | 10/2003 | Suenaga |
| 6,649,093 B2 | 11/2003 | Van Santen et al. |
| 6,781,670 B2 | 8/2004 | Krautschik |
| 6,788,477 B2 | 9/2004 | Lin |
| 6,809,794 B1 | 10/2004 | Sewell |
| 6,844,206 B1 | 1/2005 | Phan et al. |
| 6,844,919 B2 | 1/2005 | Suenaga |
| 6,952,253 B2 | 10/2005 | Lof et al. |
| 2002/0020821 A1 | 2/2002 | Van Santen et al. |
| 2002/0163629 A1 | 11/2002 | Switkes et al. |
| 2003/0123040 A1 | 7/2003 | Almogy |
| 2003/0174408 A1 | 9/2003 | Rostalski et al. |
| 2004/0000627 A1 | 1/2004 | Schuster |
| 2004/0021844 A1 | 2/2004 | Suenaga |
| 2004/0075895 A1 | 4/2004 | Lin |
| 2004/0103950 A1 | 6/2004 | Iriguchi |
| 2004/0109237 A1 | 6/2004 | Epple et al. |
| 2004/0114117 A1 | 6/2004 | Bleeker |
| 2004/0118184 A1 | 6/2004 | Violette |
| 2004/0119954 A1 | 6/2004 | Kawashima et al. |
| 2004/0125351 A1 | 7/2004 | Krautschik |
| 2004/0135099 A1 | 7/2004 | Simon et al. |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0207824 A1 | 10/2004 | Lof et al. |
| 2004/0211920 A1 | 10/2004 | Mari Derksen et al. |
| 2004/0224265 A1 | 11/2004 | Endo et al. |
| 2004/0233405 A1 | 11/2004 | Kato et al. |
| 2004/0239954 A1 | 12/2004 | Bischoff |
| 2004/0253547 A1 | 12/2004 | Endo et al. |
| 2004/0257544 A1 | 12/2004 | Vogel et al. |
| 2004/0263808 A1 | 12/2004 | Sewell |
| 2004/0263809 A1 | 12/2004 | Nakano |
| 2005/0002004 A1 | 1/2005 | Kolesnychenko et al. |
| 2005/0007569 A1* | 1/2005 | Streefkerk et al. ............. 355/30 |
| 2005/0007570 A1 | 1/2005 | Streefkerk et al. |
| 2005/0018155 A1 | 1/2005 | Cox et al. |
| 2005/0018156 A1 | 1/2005 | Mulkens et al. |
| 2005/0018208 A1 | 1/2005 | Levinson |
| 2005/0024609 A1 | 2/2005 | De Smit et al. |
| 2005/0030498 A1* | 2/2005 | Mulkens ...................... 355/30 |
| 2005/0030501 A1 | 2/2005 | Mulkens et al. |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0037269 A1 | 2/2005 | Levinson |
| 2005/0046934 A1 | 3/2005 | Ho et al. |
| 2005/0048223 A1 | 3/2005 | Pawloski et al. |
| 2005/0068499 A1 | 3/2005 | Dodoc et al. |
| 2005/0078286 A1 | 4/2005 | Dierichs et al. |
| 2005/0078287 A1 | 4/2005 | Sengers et al. |
| 2005/0231695 A1 | 10/2005 | Wang et al. |
| 2006/0077367 A1 | 4/2006 | Kobayashi et al. |
| 2006/0098178 A1 | 5/2006 | Nagasaka et al. |
| 2006/0114435 A1 | 6/2006 | Hazelton et al. |
| 2006/0232753 A1 | 10/2006 | Khmelichek et al. |
| 2006/0238721 A1 | 10/2006 | Kate et al. |

FOREIGN PATENT DOCUMENTS

| | | |
|---|---|---|
| DE | 221563 A1 | 4/1985 |
| DE | 224448 A1 | 7/1985 |
| DE | 242880 A1 | 2/1987 |
| EP | 0023231 A1 | 2/1981 |
| EP | 0418427 A2 | 3/1991 |
| EP | 1039511 A1 | 9/2000 |
| EP | 1 420 300 A2 | 5/2004 |
| EP | 1 477 856 A1 | 11/2004 |
| EP | 1 489 462 A2 | 12/2004 |
| EP | 1 632 991 A1 | 3/2006 |
| FR | 2474708 | 7/1981 |
| JP | 58-202448 A | 11/1983 |
| JP | 62-065326 A | 3/1987 |
| JP | 62-121417 A | 6/1987 |
| JP | 63-157419 A | 6/1988 |
| JP | 04-305915 A | 10/1992 |
| JP | 04-305917 A | 10/1992 |
| JP | 06-124873 A | 5/1994 |
| JP | 07-132262 A | 5/1995 |
| JP | 07-220990 A | 8/1995 |
| JP | 10-228661 A | 8/1998 |
| JP | 10-255319 A | 9/1998 |
| JP | 10-303114 A | 11/1998 |
| JP | 10-340846 A | 12/1998 |
| JP | 11-176727 A | 7/1999 |
| JP | 2000-058436 A | 2/2000 |
| JP | 2001-091849 A | 4/2001 |
| JP | 2004-193252 A | 7/2004 |
| WO | WO 99/49504 A1 | 9/1999 |
| WO | WO 2004/019128 A2 | 3/2003 |
| WO | WO 03/077036 A1 | 9/2003 |
| WO | WO 03/077037 A1 | 9/2003 |
| WO | WO 2004/053596 A2 | 6/2004 |
| WO | WO 2004/053950 A1 | 6/2004 |
| WO | WO 2004/053951 A1 | 6/2004 |
| WO | WO 2004/053952 A1 | 6/2004 |
| WO | WO 2004/053953 A1 | 6/2004 |
| WO | WO 2004/053954 A1 | 6/2004 |
| WO | WO 2004/053955 A1 | 6/2004 |
| WO | WO 2004/053956 A1 | 6/2004 |
| WO | WO 2004/053957 A1 | 6/2004 |
| WO | WO 2004/053958 A1 | 6/2004 |
| WO | WO 2004/053959 A1 | 6/2004 |
| WO | WO 2004/055803 A1 | 7/2004 |
| WO | WO 2004/057295 A2 | 7/2004 |
| WO | WO 2004/057589 A1 | 7/2004 |
| WO | WO 2004/086468 A1 | 10/2004 |
| WO | WO 2004/086470 A1 | 10/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/090956 A1 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2004/097911 A1 | 11/2004 |
| WO | WO 2004/102646 A1 | 11/2004 |
| WO | WO 2004/105106 A1 | 12/2004 |
| WO | WO 2004/105107 A1 | 12/2004 |
| WO | WO 2004/107011 A1 | 12/2004 |
| WO | WO 2004/107417 A1 | 12/2004 |
| WO | WO 2004/112108 A1 | 12/2004 |
| WO | WO 2004/114380 A1 | 12/2004 |
| WO | WO 2005/015315 A2 | 2/2005 |
| WO | WO 2005/022616 A1 | 3/2005 |
| WO | WO 2005/036623 A1 | 4/2005 |
| WO | WO 2005/062351 A1 | 7/2005 |

OTHER PUBLICATIONS

Hata, H., "The Development of Immersion Exposure Tools", Litho Forum, International SEMATECH, Los Angeles, Jan. 27-29, 2004.

Hoffnagle, J.A. et al., "Liquid Immersion Deep-Ultraviolet Interferometric Lithography", J. Vac. Sci. Technol. B., vol. 17, No. 6, Nov./Dec. 1999, pp. 3306-3309.

Hogan, H., "New Semiconductor Lithography Makes a Splash", Photonics Technology World, Photonics Spectra, Oct. 2003.

Kawata, H. et al., "Fabrication of 0.2µm Fine Patterns Using Optical Projection Lithography with an Oil Immersion Lens", Jpn. J. Appl. Phys. vol. 31 (1992), pp. 4174-4177.

Kawata, H. et al., "Optical Projection Lithography using Lenses with Numerical Apertures Greater than Unity", Microelectronic Engineering 9 (1989), pp. 31-36.

Lin, B.J., "Drivers, Prospects and Challenges for Immersion Lithography", TSMC, Inc., Sep. 2002.

Lin, B.J., "Proximity Printing Through Liquid", IBM Technical Disclosure Bulletin, vol. 20, No. 11B, Apr. 1978, p. 4997.

Lin, B.J., "The k3 Coefficient in Nonparaxial 1/NA Scaling Equations for Resolution, Depth of Focus, and Immersion Lithography," *Journal of Microlithography, Microfabrication, and Microsystems*, vol. 1, No. 1, pp. 7-12, Apr. 2002.

Lin, B.J., "The Paths To Subhalf-Micrometer Optical Lithography", SPIE vol. 922, Optical/Laser Microlithography (1988), pp. 256-269.

Matsuyama, T. et al., "Nikon Projection Lens Update", SPIE Microlithography 2004, 5377-65, Mar. 2004.

Nikon Precision Europe GmbH, "Investor Relations—Nikon's Real Solutions", May 15, 2003.

Owa, S. et al., "Advantage and Feasibility of Immersion Lithography", Proc. SPIE 5040 (2003).

Owa, S. et al., "Immersion Lithography; its potential performance and issues", SPIE Microlithography 2003, 5040-186, Feb. 27, 2003.

Owa, S. et al., "Potential Performance and Feasibility of Immersion Lithography", NGL Workshop 2003, Jul. 10, 2003.

Owa, S. et al., "Update on 193nm Immersion Exposure Tool", Litho Forum, International SEMATECH, Los Angeles, Jan. 27-29, 2004.

Owen, G. et al., "1/8µm Optical Lithography", J. Vac. Sci. Technol. B., vol. 10, No. 6, Nov./Dec. 1992, pp. 3032-3036.

Smith, B.W. et al., "Immersion Optical Lithography at 193nm", Future Fab International, vol. 15, Jul. 11, 2003.

Stevens, G.W.W., "Reduction of Waste Resulting from Mask Defects", Solid State Technology, Aug. 1978, vol. 21 008, pp. 68-72.

Suzuki, A., "Lithography Advances on Multiple Fronts", EEdesign, EE Times, Jan. 5, 2004.

Switkes, M. et al., "Immersion Lithography at 157 nm ", J. Vac. Sci. Technol. B., vol. 19, No. 6, Nov./Dec. 2001, pp. 2353-2356.

Switkes, M. et al., "Immersion Lithography at 157 nm", MIT Lincoln Lab, Orlando 2001-1, Dec. 17, 2001.

Switkes, M. et al., "Immersion Lithography: Optics for the 50 nm Node", 157 Anvers-1, Sep. 4, 2002.

International Search Report, dated Apr. 19, 2006, for PCT Application No. PCT/NL2006/000202, 13 pages.

\* cited by examiner

$$P_M = P_{amb} - P_w - \frac{4\sigma}{H}$$

LIQUID IMMERSION LITHOGRAPHY SYSTEM WITH TILTED LIQUID FLOW

CROSS REFERENCE TO RELATED APPLICATIONS

This application is a continuation of U.S. application Ser. No. 11/108,673, filed Apr. 19, 2005, which is incorporated by reference herein in its entirety.

This application is related to U.S. application Ser. No. 11/403,196, filed Apr. 13, 2006, which is incorporated by reference herein in its entirety, and which is a continuation-in-part of U.S. application Ser. No. 11/108,673, filed Apr. 19, 2005.

BACKGROUND OF THE INVENTION

1. Field of the Invention

The present invention is related to liquid immersion lithography, and more particularly, to efficient recirculation of liquid in immersion lithography systems.

2. Description of the Related Art

An integrated circuit ("IC") integrates a large number of electronic circuit elements, including transistors. The circuit elements are manufactured and interconnected on a semiconductor substrate, e.g., on a single crystalline silicon wafer. During manufacturing, the wafers undergo cycles of film deposition and lithography, in addition to other processing. Film deposition is the process of depositing a layer of material, e.g., insulating or metallic, over the entire substrate; lithography is the process of patterning the deposited layer. The first step in lithography involves coating the wafer with photoresist that is sensitive to particular radiation, typically ultra-violet light. During the next step—exposure—the substrate is exposed to a radiation pattern stored on a mask, also called a reticle. Radiation locally changes the physical or chemical properties of the photoresist, and the exposed (or unexposed) areas are selectively dissolved during a developing step that leaves behind a pattern of photoresist. The patterned photoresist provides a pattern for a subsequent etching step. The etching step removes undesired areas of the deposited layer, leaving behind structures associated with circuit elements, such as wires, resistors and transistors, and the like.

Highly integrated circuits require small circuit elements. Since the radiation pattern shapes the circuit elements, the smallest feature size depends on the resolution achieved in the lithography exposure step, or the resolution of the projection device used to project the radiation pattern onto the substrate.

According to the Raleigh criterion, this resolution is proportional to the wavelength $\lambda$ of the projected light and to an adjustment factor $k_1$, and inversely proportional to the sine function of the marginal, or capture, angle $\theta$ of the projection optics, where:

$$\text{Resolution} = k_1 * \lambda / \sin(\theta)$$

The resolution can be decreased, i.e., improved, in one of three ways. First, the wavelength $\lambda$ of the projected light can be decreased. A shorter wavelength, however, may require new photoresist and a number of changes in the projection device, such as using a different light source and light filters, and special lenses for the projection optics. Second, the resolution can be decreased by decreasing the adjustment factor $k_1$. Decreasing $k_1$ may also require the use of different photoresist and high precision tools. Third, the marginal angle $\theta$ can be increased by increasing the size of the projection optics. The effect of this increase, however, is limited by the sine function above.

One way to reduce the wavelength $\lambda$ of the projected light is through the use of immersion lithography, where a liquid is injected between the projection optics and the wafer, taking advantage of the higher refractive index of the liquid compared to air (and, therefore, resulting in a smaller effective wavelength $\lambda$).

One of the persistent problems in immersion lithography relates to ensuring purity and lack of contamination of the immersion liquid. The immersion liquid is generally recirculated, using some form of an injection system to inject the liquid into the volume between the projection optics and the substrate, and extracted using some form of a extraction, or suction system to extract the liquid from the exposure area back into recirculation. However, the liquid can get contaminated, for example, due to pickup of particles from the air, or due to pickup of material from the photo resist that is being exposed. Normally, filtering systems are in place to remove the contaminants. However, not all of the liquid that is injected into the exposure area can actually be recirculated. This is due to the surface tension that exists between the liquid and the substrate surface. Although most of the liquid can be extracted, using the suction pressure of the extraction/recirculation system, some droplets of liquid remain on the surface of the way of the substrate, together with their contaminants. Increasing the suction pressure generally does not help past a certain point, since this will increase the recirculation speed, but will not address the problems caused by the surface tension of the liquid.

Even with the current designs, many liquid injection and extraction systems utilize a fairly complex showerhead design to deliver and extract the immersion liquid. However, even in such complex designs, the problem of the surface tension of the liquid is not entirely solved.

Accordingly, what is needed is an approach that ensures that all of the injected liquid is collected by the extraction system in an immersion lithography tool.

SUMMARY OF THE INVENTION

The present invention is directed to liquid immersion lithography system with tilted liquid flow that substantially obviates one or more of the problems and disadvantages of the related art.

There is provided a liquid immersion lithography system including a projection optical system for directing electromagnetic radiation onto a substrate, and a showerhead for delivering liquid flow between the projection optical system and the substrate. The showerhead includes an injection nozzle and a retrieval nozzle located at different heights. The liquid flow is tilted relative to the substrate. A direction from the injection nozzle to the retrieval nozzle is tilted at approximately 1 to 2 degrees relative to the substrate.

In another aspect, a liquid immersion lithography system includes a projection optical system for exposing a substrate, an injection nozzle and a retrieval nozzle for delivering tilted liquid flow between the projection optical system and the substrate. The liquid flow is tilted at approximately 1 to 2 degrees relative to the substrate.

In another aspect, an exposure system includes, in order of light propagation, an illumination source, a condenser lens, a mask (or contrast device) and projection optics. A liquid delivery system provides liquid to an exposure area below the projection optics. The exposure system also includes means for providing tilted liquid flow of the liquid.

In another aspect, an exposure system includes, in order of light propagation, an illumination source, a condenser lens, a mask and projection optics. A liquid delivery system provides liquid to an exposure area of a substrate. The substrate is tilted relative to a horizontal.

Additional features and advantages of the invention will be set forth in the description that follows. Yet further features and advantages will be apparent to a person skilled in the art based on the description set forth herein or may be learned by practice of the invention. The advantages of the invention will be realized and attained by the structure particularly pointed out in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS/FIGS.

The accompanying drawings, which are included to provide a further understanding of the exemplary embodiments of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the embodiments of the present invention, examples of which are illustrated in the accompanying drawings.

The inventors have discovered a rather unexpected phenomenon: when the liquid flow in an immersion lithography system is tilted, even by a relatively small angle, as little as one or two degrees, the tilt, and the corresponding effect of gravity on the liquid flow, is sufficient to overcome the residual surface tension forces acting on the liquid. Accordingly, with such a tilted arrangement, the pooling of the immersion liquid in certain portions of the exposure area can be avoided, reducing the possibility of contamination.

Figure 7:
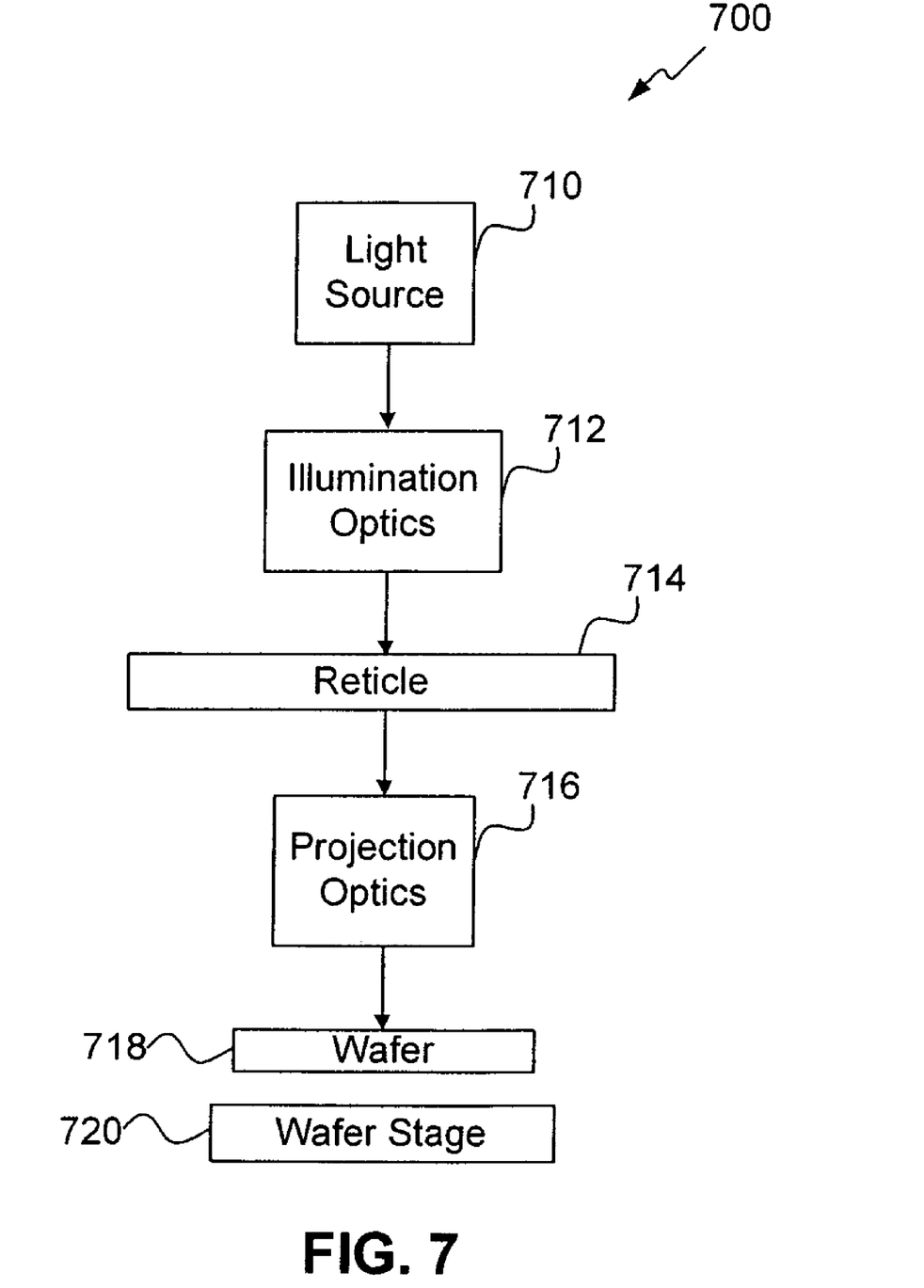
FIG. 7 shows an exemplary photolithographic system that uses the tilted showerhead.

FIG. 7 shows an exemplary photolithographic system that uses the tilted showerhead. As shown in FIG. 7, the lithographic system 700 (shown in side view) includes a light source (illumination source) 710, such as a laser or a lamp, illumination optics 712 (such as a condenser lens), and a reticle (i.e., a, mask, or a contrast device) 714, which is usually mounted on a reticle stage (not shown). Note that the reticle 714 can be a plate with an exposure pattern on it, or a spatial light modulator array, such as used in maskless lithography. Light from the reticle 714 is imaged onto a wafer 718 using projection optics 716. The wafer 718 is mounted on a wafer stage 720.

Figure 1:
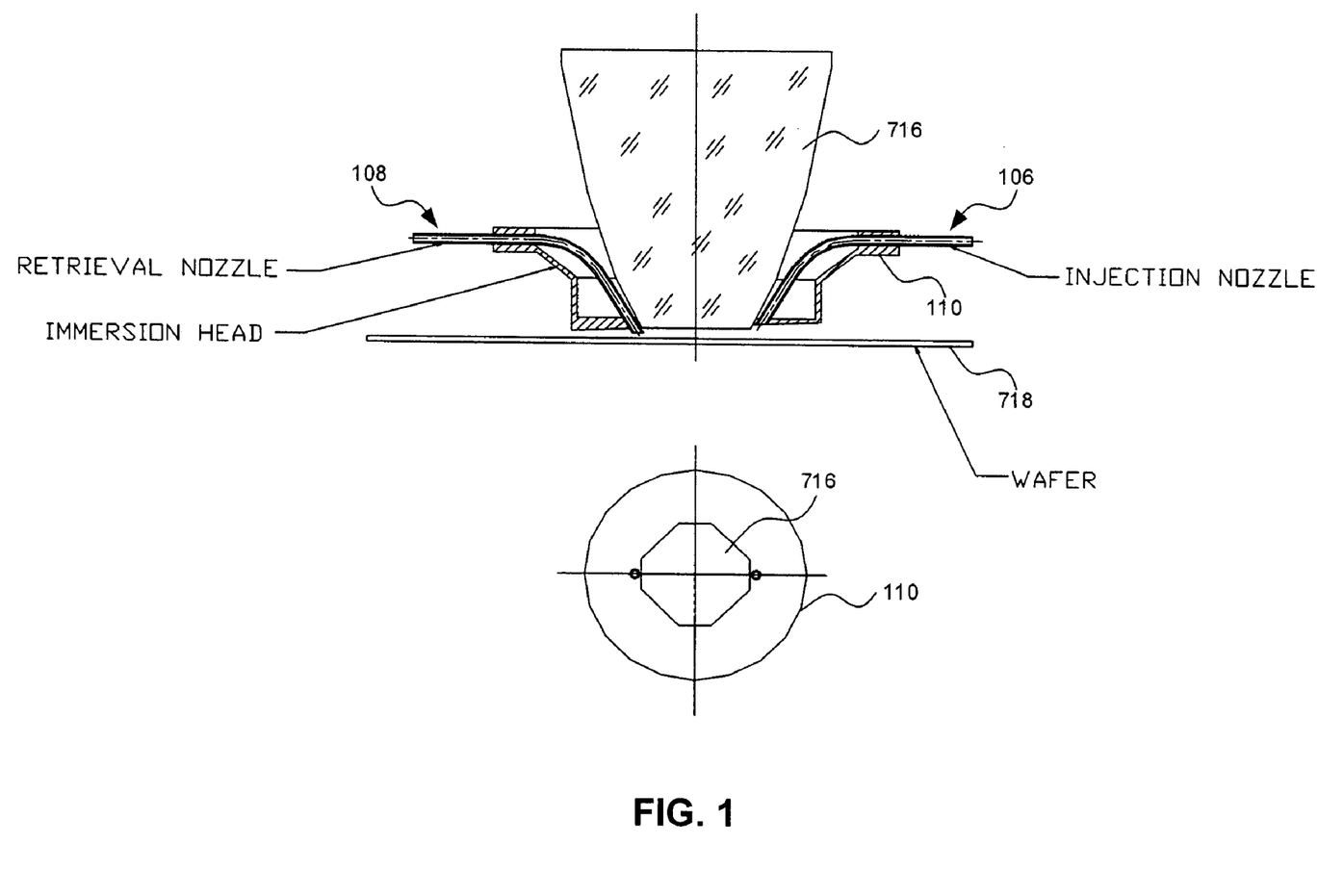
FIG. 1 illustrates one embodiment of the invention that uses a tilted showerhead for injection and extraction of the immersion liquid.

FIG. 1 illustrates one embodiment of the invention that uses a tilted showerhead for injection and extraction of the immersion liquid. As shown in FIG. 1, the projection optics 716 is mounted above a substrate, such as the semiconductor wafer 718. One portion of a showerhead is used for liquid injection, and a second portion of the showerhead is used for liquid extraction.

FIG. 1 thus illustrates a cross-sectional view (at the top) and a plan view (at the bottom) of one embodiment of the immersion lithography system with tilted liquid flow arrangement. A lower portion of the projection optical system 716 is located above the wafer 718 (note that the last element of the projection optical system 716 can be a prism, or a lens, or a glass window). Also shown in FIG. 1 is a immersion head, or shower head 110, which is shown in cross section. Liquid flow enters the exposure area through an injection nozzle 106, and exits through a retrieval, or suction, nozzle 108. Note the different heights of the injection nozzle 106 and the retrieval nozzle 108 in the exposure area illustrated in more detail in FIG. 2, which provides for a height differential, and therefore for a tilted liquid flow.

The dimension of the gap between the lowest element of the projection optics 716 (which can be either a lens or a prism) and the surface of the substrate 718 is usually on the order of approximately one millimeter (typically ranging between about 0.5 millimeters and 2 millimeters). Thus, it is possible to leave one of the nozzles (either injection or extraction) in its original place and correspondingly raise or lower the other nozzle, so as to create a tilt.

The relative arrangement of the two nozzles is such that there is a natural gravity-induced liquid flow from the injection showerhead to the extraction showerhead. As noted above, the tilt can be relatively small, even as little as one or two degrees. Note that the important aspect is the relative arrangement of the injection and extraction nozzles, such that there is a relative tilt of the liquid flow compared to the plane of the wafer 102 (which is normally horizontal).

Figure 2:
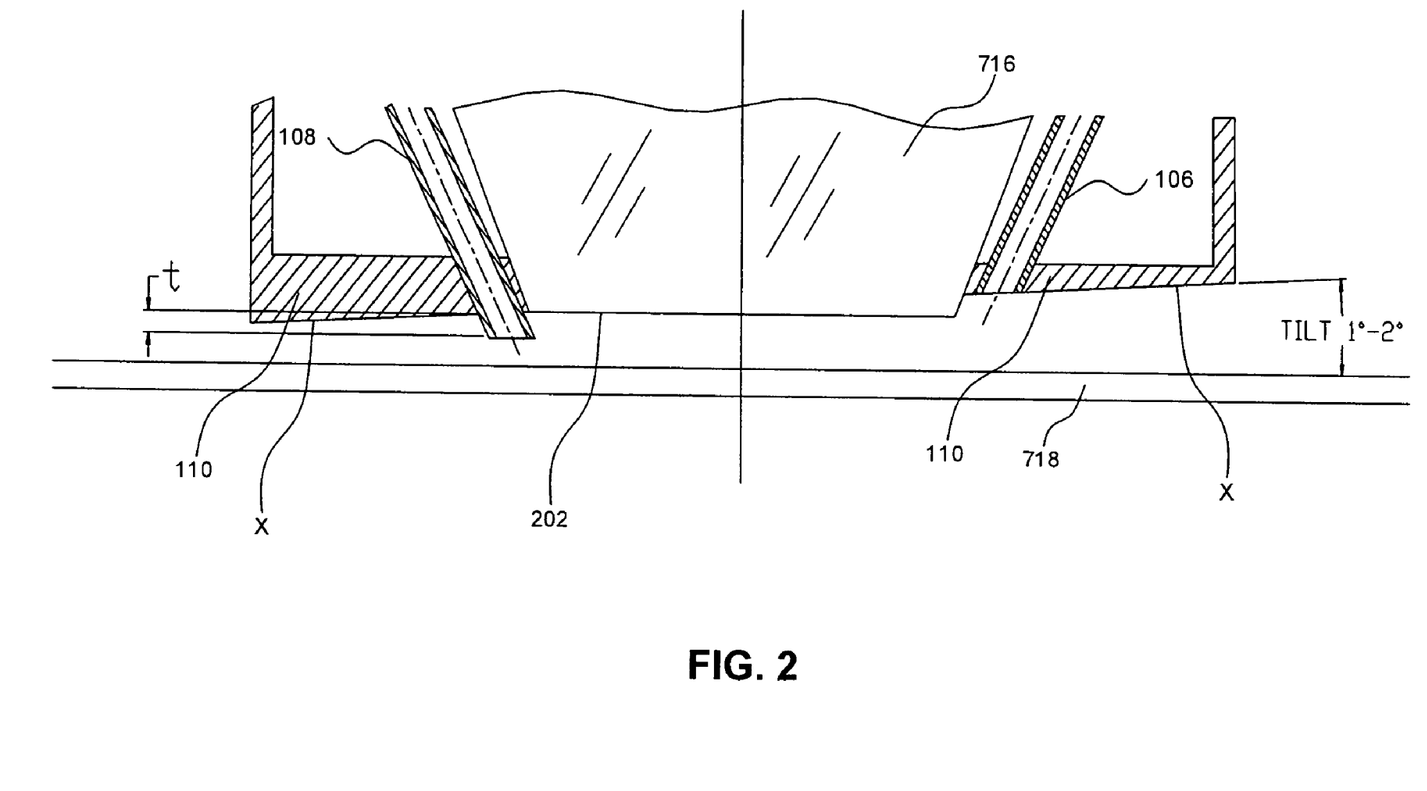
FIG. 2 illustrates a close-up view of the tilted showerhead arrangement of FIG. 1.

FIG. 2 illustrates a close up view of the tilted nozzle arrangement. Note in particular the bottom surface of the showerhead, labeled X in FIG. 2, which is tilted at approximately one or two degrees as shown in the figure.

Note also that the suction nozzle 108 is located below a bottom surface 202 of the projection optical system 716 by a distance t (see left hand side of the figure).

Figure 3:
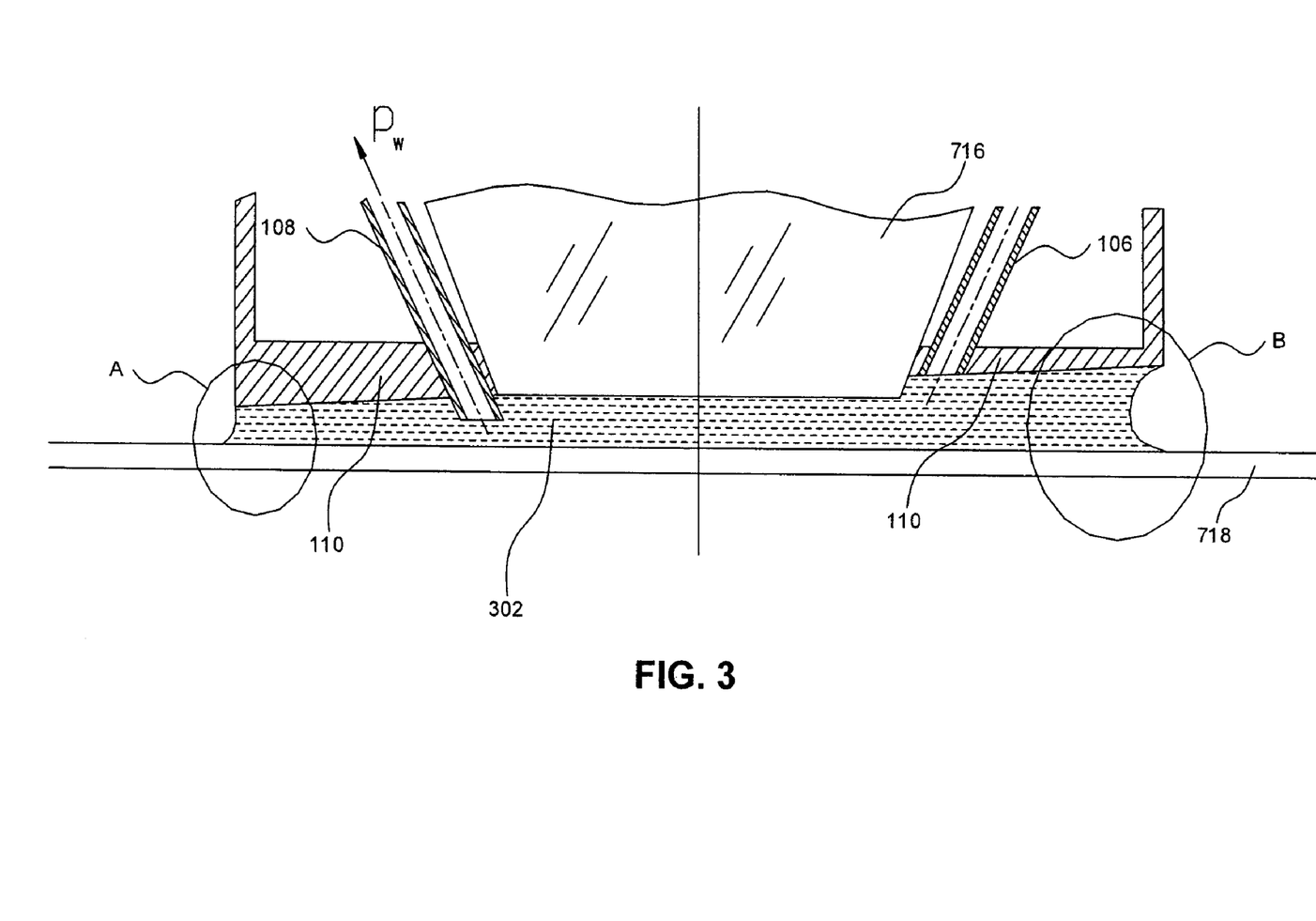
FIG. 3 is another illustration of the exposure area of a liquid immersion lithography system with a liquid in the exposure area.

FIG. 3 is another illustration of the exposure area of a liquid immersion lithography system, similar to FIG. 2, but showing a liquid 302 in the exposure area, as would be the case during actual operation of the device.

Note also a withdrawal pressure $P_w$, and two regions A and B, which include two meniscus regions, discussed further below.

Figure 4:
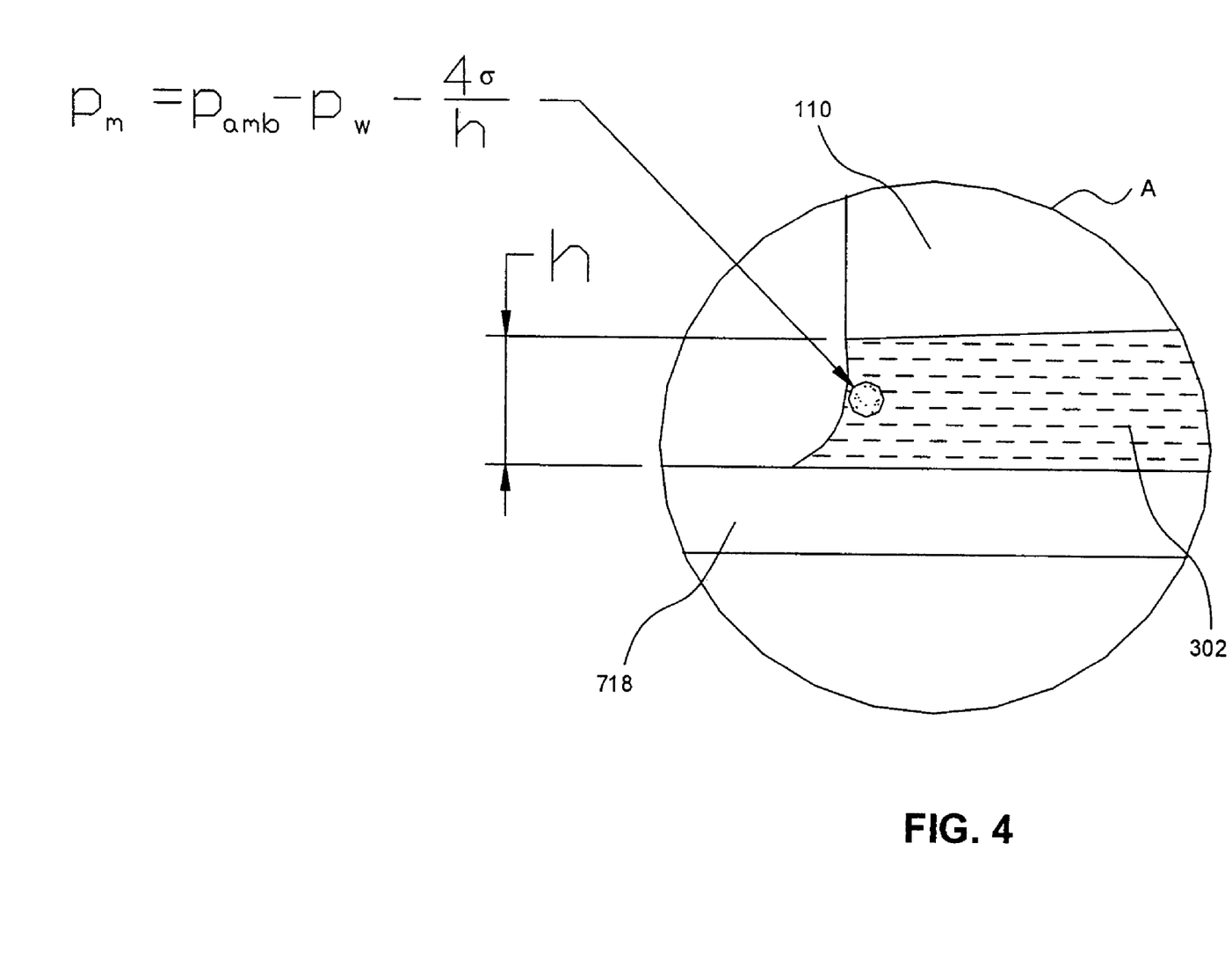
FIG. 4 illustrates a meniscus region A of FIG. 3.

FIG. 4 illustrates a meniscus region A from FIG. 3. Note a height "h," which refers to a gap height, and the shape of the meniscus, which is outward. The pressure in the liquid adjacent to the meniscus ($p_m$) will be reduced due to the effect of surface tension. The exact pressure at this location will depend on the detailed shape of the meniscus and include effects related to the contact angles. However, an order of magnitude estimate of this pressure depression is given by:

$$p_m = p_{amb} - p_w - \frac{4\sigma}{h}$$

where $P_{amb}$ is the ambient pressure, $p_w$ is the withdrawal pressure, $\sigma$ is the surface tension and h is the gap height (see FIG. 4). (See generally J. Fay, *Introduction to Fluid Mechanics*, MIT Press, Cambridge, Mass. (1994), which is incorporated herein by reference.

Figure 5:
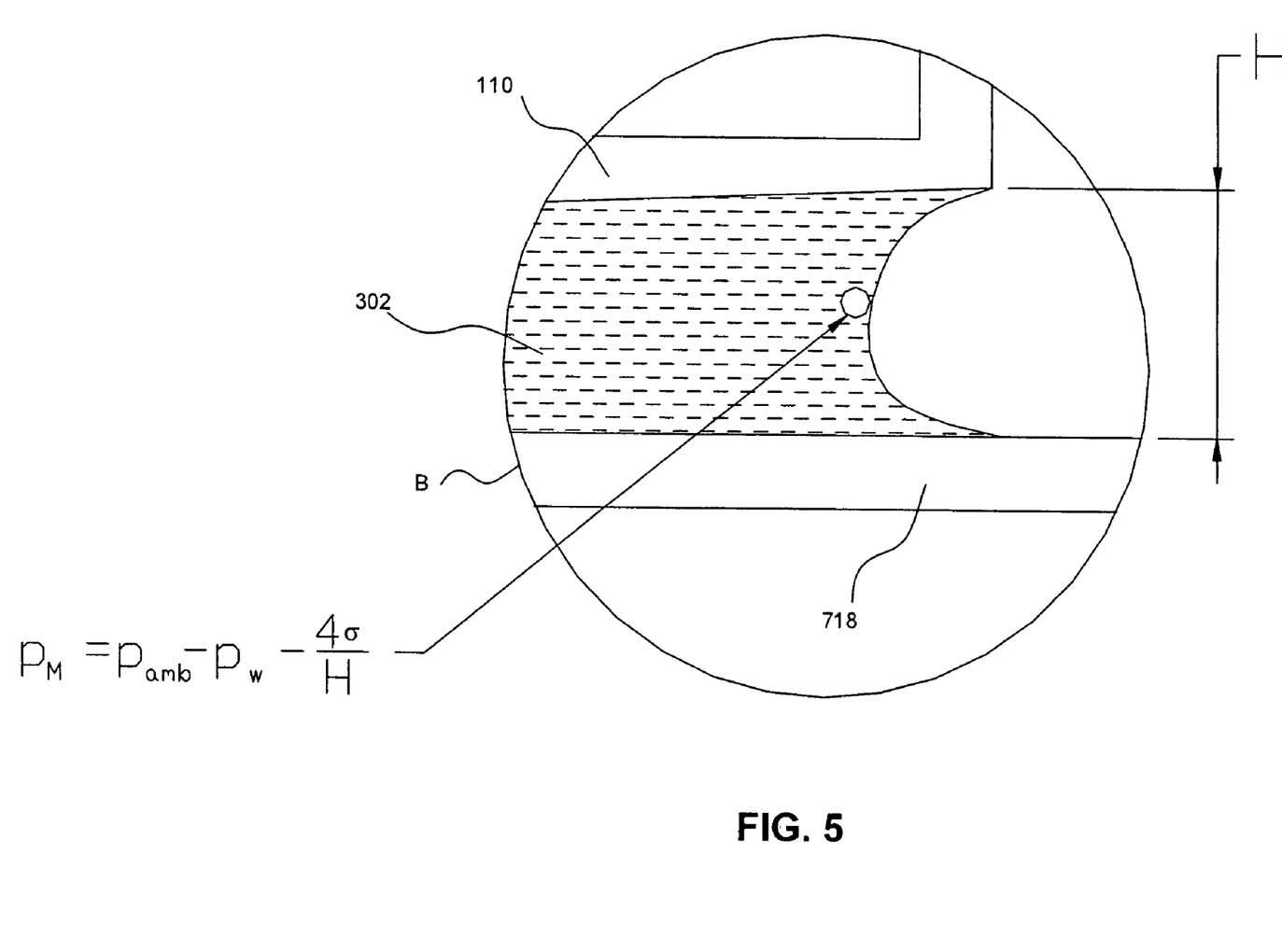
FIG. 5 illustrates a meniscus region B of FIG. 3.

FIG. 5 illustrates a region B from FIG. 3 with a gap height "H" between the showerhead 110 and the wafer 718. Note that the meniscus is inward shaped, with the pressure in the liquid given by:

$$p_M = p_{amb} - p_w - \frac{4\sigma}{H}$$

Because H>h, $p_M$>$p_m$ and liquid will start flowing from the side that has the bigger gap.

Figure 6:
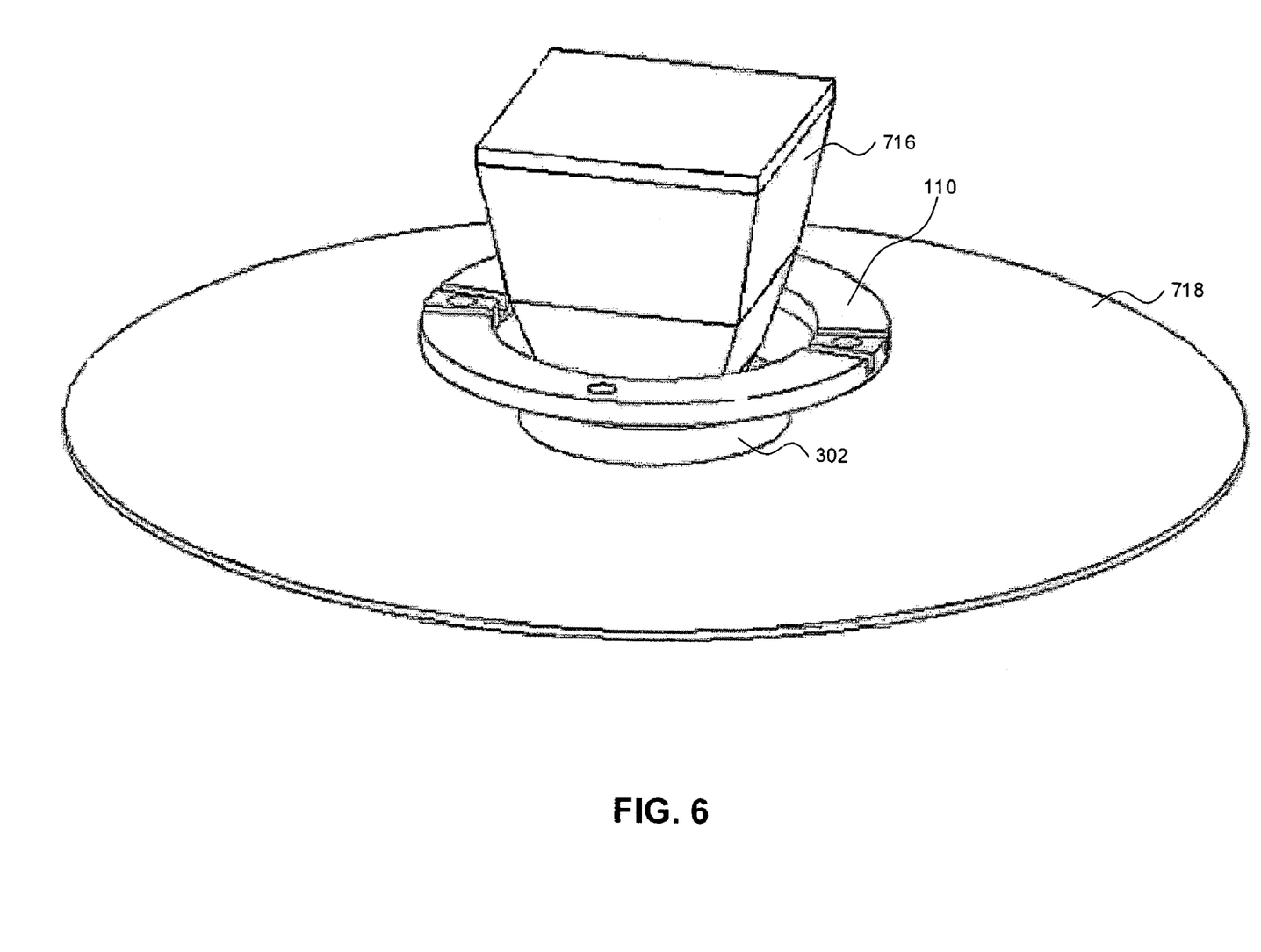
FIG. 6 illustrates a three-dimensional isometric view of the embodiment illustrated in FIGS. 1-5.

FIG. 6 is another illustration of the embodiment illustrated in FIGS. 1-5, in this case, a three-dimensional isometric view. Shown in FIG. 6 is the wafer 718 positioned below the projection system 716 (only a portion of which is shown). The showerhead 110 is visible in the figure, with the liquid 302 flowing under the projection optical system 716.

In another embodiment, it is possible to accomplish the tilting effect by tilting the wafer surface. Normally, in conventional systems, the wafer 718 is kept perfectly horizontal (or, as horizontal as practical), to ensure good image quality. However, it is possible to tilt the wafer 718 (and, correspondingly, the rest of the exposure optics, such that the wafer surface is tilted by approximately one or two degrees, so as to encourage liquid flow in the direction from the injection port to the extraction port. Such an approach is more complicated to implement than the embodiment described above, since tilting the entire lithographic tool may be undesirable or mechanically problematic. However, such a tilting of the entire lithographic tool will accomplish the same purpose—creation of a preferred direction of liquid flow even in the absence of suction pressure for extraction.

As yet a third embodiment, the tilting effect can be simulated using forced air flow. In other words, even if the injection and extraction ports are level with each other, and the substrate is also oriented perfectly horizontally, an air pressure gradient in the direction from the injection port to the extraction port will also achieve a similar effect—that is, overcoming the surface tension forces that otherwise impede liquid flow.

Conclusion

While various embodiments of the present invention have been described above, it should be understood that they have been presented by way of example, and not limitation. It will be apparent to persons skilled in the relevant art that various changes in form and detail can be made therein without departing from the spirit and scope of the invention.

What is claimed is:

1. A method, comprising:
   (a) injecting an immersion fluid into an exposure area between a projection system and a substrate using a showerhead attached to the projection system;
   (b) performing exposure of the substrate through directing patterned illumination onto the substrate through the immersion fluid using the projection system as the substrate is scanned;
   (c) retrieving the immersion fluid from the exposure area after step (b); and
   (d) positioning a retrieval nozzle, which performs step (c), at a different height with respect to the substrate and with respect to an injection nozzle, which performs step (a), while maintaining the showerhead at a constant angle with respect to the substrate to form a tilted flow of the immersion fluid during retrieval of the immersion fluid after step (b).

2. The method of claim 1, wherein a plane passing through an opening of the retrieval nozzle and an opening of the injection nozzle is angled at about 1 or 2 degrees with respect to a plane in which the substrate lies.

3. The method of claim 1, wherein substantially all of the immersion fluid is removed during step (c) based on step (d).

* * * * *